(12) United States Patent
Daubenspeck et al.

(10) Patent No.: US 7,232,695 B2
(45) Date of Patent: Jun. 19, 2007

(54) METHOD AND APPARATUS FOR COMPLETELY COVERING A WAFER WITH A PASSIVATING MATERIAL

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Jeffrey S. Zimmerman, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 11/160,154

(22) Filed: Jun. 10, 2005

(65) Prior Publication Data

US 2006/0281197 A1 Dec. 14, 2006

(51) Int. Cl.
*G01R 31/26* (2006.01)
(52) U.S. Cl. .................... 438/14; 438/780; 257/48; 257/E23.179; 257/E21.53

(58) Field of Classification Search .................. 438/14
See application file for complete search history.

(56) References Cited

U.S. PATENT DOCUMENTS

| 6,166,808 | A | 12/2000 | Greve |
| 6,753,972 | B1 | 6/2004 | Hirose et al. |
| 6,897,079 | B2 * | 5/2005 | Hirose et al. ................. 438/16 |
| 2004/0070773 | A1 | 4/2004 | Hirose et al. |
| 2004/0145747 | A1 | 7/2004 | Jasapara |

* cited by examiner

*Primary Examiner*—Tu-Tu Ho
(74) *Attorney, Agent, or Firm*—Edward W. Brown; William D. Sabo

(57) ABSTRACT

A method and apparatus for determining the complete coverage of a passivating material on the final conductive interconnection of a wafer containing integrated circuits. A test structure with the dimensions of the final interconnections of the integrated circuits is formed during manufacture of the integrated circuits and used to determine complete coverage of the wafer by creating an opening in the passivating material at the test structure, the size of the opening being indicative of the complete coverage of the wafer.

20 Claims, 3 Drawing Sheets

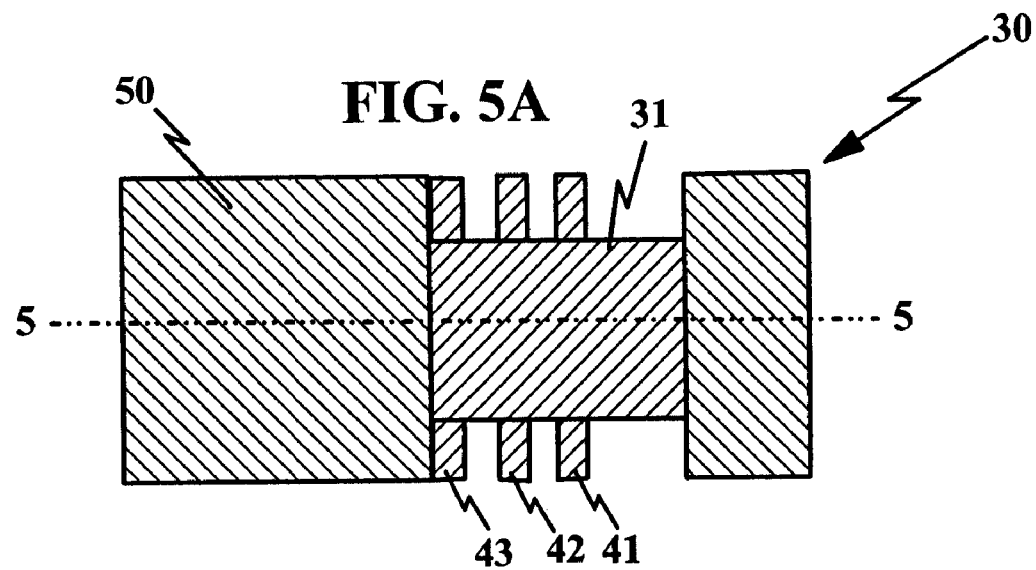
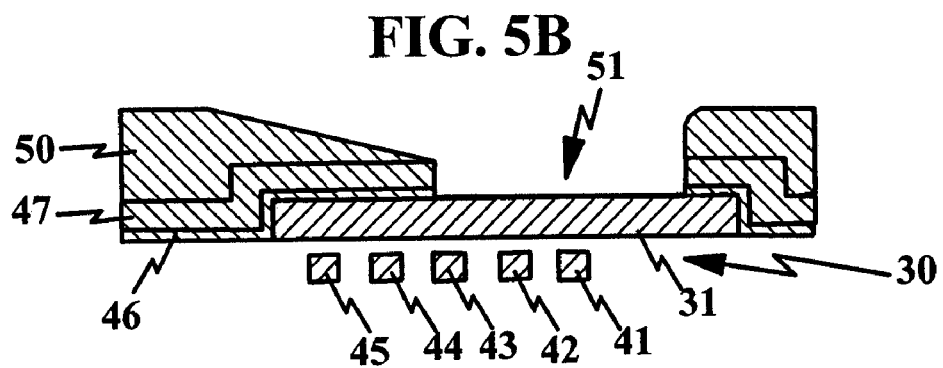

METHOD AND APPARATUS FOR COMPLETELY COVERING A WAFER WITH A PASSIVATING MATERIAL

FIELD OF THE INVENTION

The present invention relates to fabricating integrated circuits, containing a passivating material coating and, more specifically, relates to fabricating such circuits and determining the coverage of the passivating material on the integrated circuits.

BACKGROUND OF THE INVENTION

The fabrication of integrated circuits devices is well known. They are manufactured by fabricating a plurality of active devices, such as field effect transistors (FET) and passive devices on and in a semiconductor wafer substrate, such as silicon. The transistors and devices are connected by conductive material, such as metal or polysilicon, in the form or conductive patterns. Normally, the metal is either aluminum including aluminum alloys or copper. A passivating layer is applied over the last or final conductive layer of the wafer for reliability purposes.

To achieve higher levels of integration and greater density of devices on the wafer, the present trend is to fabricate the interconnecting pattern with finer conductive lines and more layers and thereby make the upper surface of the wafer more complex. This complexity creates of the requirement of knowing whether the upper surface of the wafer is completely covered with the passivating material. Without such complete coverage, any uncoated integrated circuits would become unreliable.

Determining complete coverage of the wafer with the passivating material by measuring its thickness is difficult. In addition, the final wiring structure is deposited thick and substractively etched, adding to the difficulty of thickness measurement of the passivating material. Thus, there is a need for an accurate method to verify that the thickness of the passivating material is sufficient to completely cover the integrated circuits on the wafer. One solution would be to coat the wafer with an excess of the passivating material to more than completely cover the wafer. However, the passivating material is expensive and this solution would also reduce patterning accuracy of said passivation layer. Accordingly, an accurate method is needed for determining the complete coverage of the integrated circuits on the wafer without any wastage of the expensive passivating material.

SUMMARY OF THE INVENTION

Therefore, it is an object of the present invention to provide a method and apparatus for accurately determining the complete coverage of a passivating coating on a wafer of integrated circuits after the manufacture of the wafer of integrated circuits.

Another object of the present invention is to provide a method and apparatus for accurately determining the complete coverage of a passivating coating on a wafer of integrated circuits after the application of the passivating material while minimizing the amount of passivating material being coated.

A further object of the present invention is to provide a method and apparatus, for completely covering the wafer with a passivating material, which method is tailored for the integrated circuit structure of each wafer being manufactured.

The foregoing and other objects are achieved by the method and apparatus of the present invention by forming a test structure on a wafer that is isolated or separated from the integrated circuits on the wafer being manufactured and comprising a conductive structure of a plate and the minimum width conductive wires formed in the final level of interconnections and positioned beneath or in the same plane as the plate. In coating the passivating layer, the coating is formed with an opening and a slope from the full thickness of the passivating material on the isolated test structure. By monitoring the size of the opening and, the number of wires visible by an optical apparatus, an accurate determination can be made that the wafer is completely coated with the passivating material. Preferably, the passivating coating contains a sensitizer and the coating is exposed through a half tone mask to create the slope in the coating.

The deposition coverage of the passivating coating, herein, by spin coating, is monitored by using optical device, such as a microscope. In making a determination of whether the integrated circuits of the wafer have been completely covered with the passivating material, the microscope is used to identify the size of the opening and number of wires, if any, are visible in the opening. In applying the passivating material, the size of the opening and the number of wires, if any, are calculated so that the passivating material will be thick enough to completely cover the integrated circuits of the wafer.

BRIEF DESCRIPTION OF THE DRAWINGS

The foregoing and other objects, aspects and advantages will be better understood from the following detailed description of preferred embodiments of the invention with reference in the drawings, in which:

FIG. 5A is a plan view of the isolated test structure of the present invention with the passivating material deposited and shown with a larger opening in the isolated test structure to the plate than the opening in FIGS. 4A and 4B.

FIG. 5B is a cross-sectional view of the isolated test structure of the present invention taken along line 5—5 of FIG. 5A and with the passivating material deposited and exposed through a half tone mask (not shown) to create the opening on the isolated test structure.

DETAILED DESCRIPTION OF THE PREFERRED EMBODIMENTS OF THE INVENTION

Figure 1:
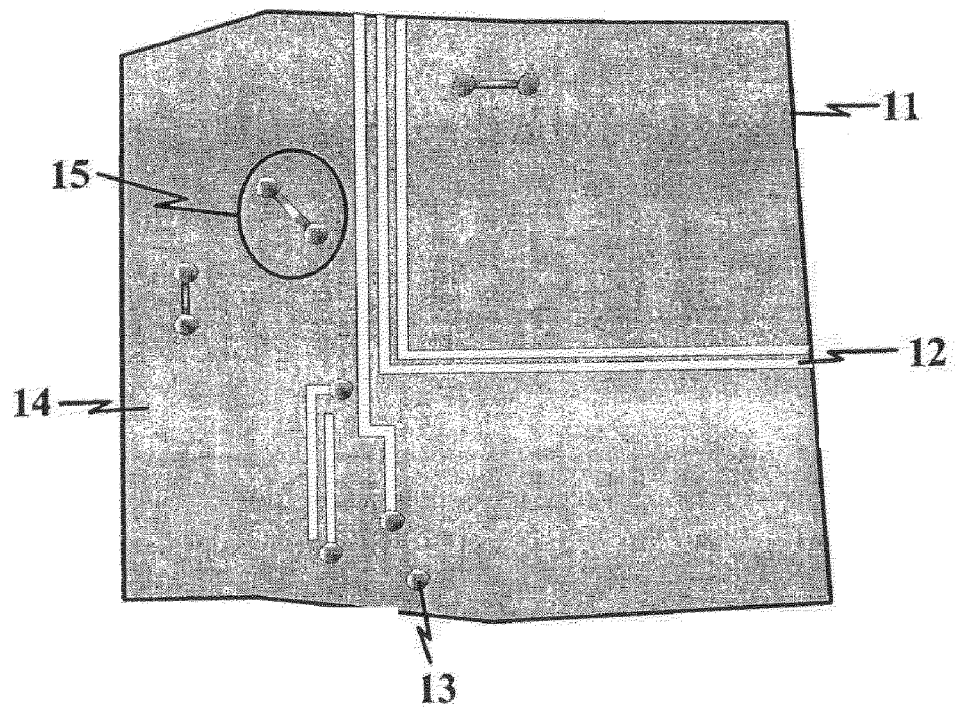
FIG. 1 PRIOR ART is a replica of a picture of a plan view of a portion of the final wiring of an integrated circuit on and in a wafer and with an identifying circle showing a wire with missing passivating material.
Figure 2:
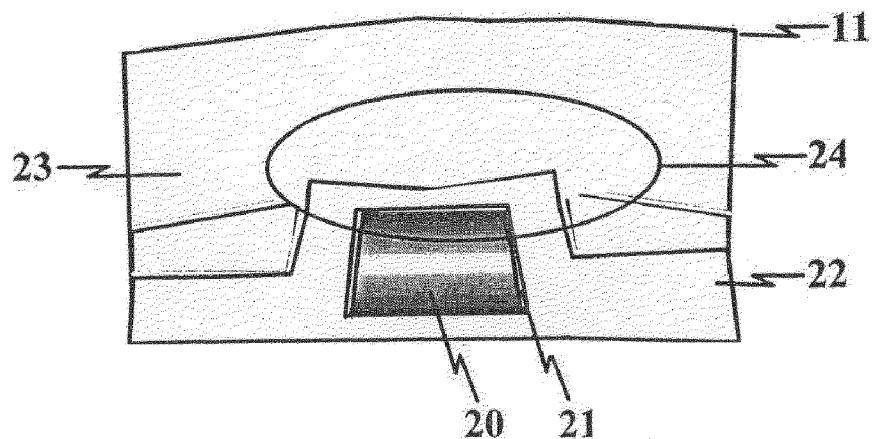
FIG. 2 PRIOR ART is a replica of a 3-dimensional picture of a scanning electron microscope (SEGM) view and with an identifying circle around a portion of a pad of an integrated circuit with missing passivating material.

As depicted in FIG. 1 PRIOR ART, a replica of the top of a portion of a picture of a wafer 11 containing integrated circuits is shown with wiring patterns 12 and connecting pads 13. On the surface of the wafer 11 is a passivating material or layer 14, herein polyimide. A circle 15 on the replica of the wafer identifies missing polyimide and the possibility that integrated circuit with that connection will be unreliable. The polyimide was spin coated on the wafer 11 without having a method, such as the present invention, to determine whether the upper or final conductors and, hence, the integrated circuits in and on the wafer were completely covered with polyimide. In FIG. 2 PRIOR ART, there is shown a replica of a portion of the wafer 11 as depicted from a 3-dimentional SEGM picture. The replica shows an aluminum conductor 20 covered with a silicon oxide layer 21 which, in turn, is covered with a silicon nitride layer 22. A polyimide layer 23 should have completely covered the silicon nitride 22 and, hence, the conductor 20, but an area is shown to be missing by the circle 24.

Figure 3:
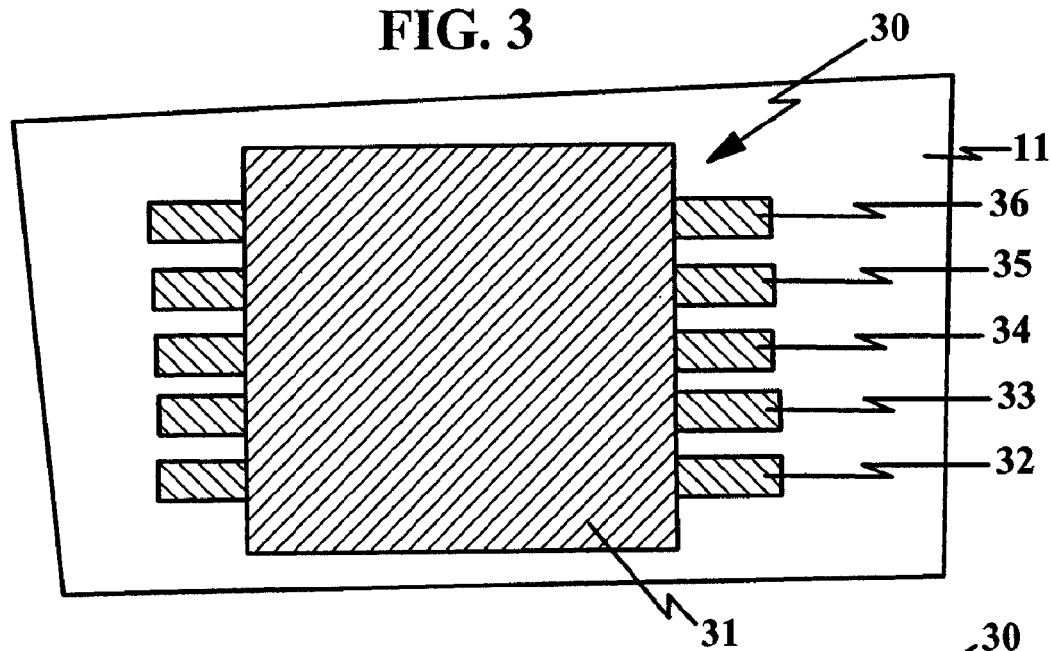
FIG. 3 is a plan view of the isolated test structure of the present invention showing a plate and thin wires beneath the plate.

In accordance with the present invention, an isolated test structure 30 is shown on the wafer 11 in FIG. 3 and comprising a conductive plate 31, such as aluminum, and thin conductive wires, herein five aluminum wires 32, 33, 34, 35, and 36, beneath the plate 31. Alternatively, the thin wires 32–36 can be positioned or formed in the same plane as the plate 31.

Figure 4A:
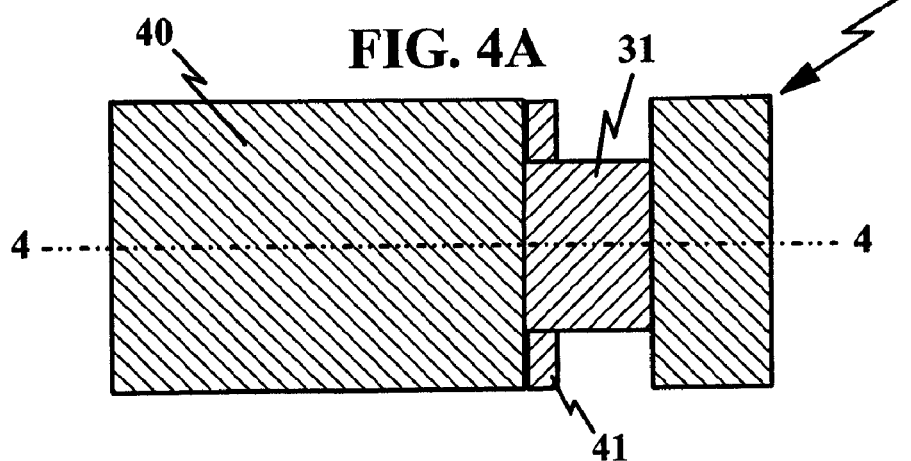
FIG. 4A is a plan view of the isolated test structure of the present invention with the passivating material deposited and shown with a small opening in the isolated test structure to the plate.
Figure 4B:
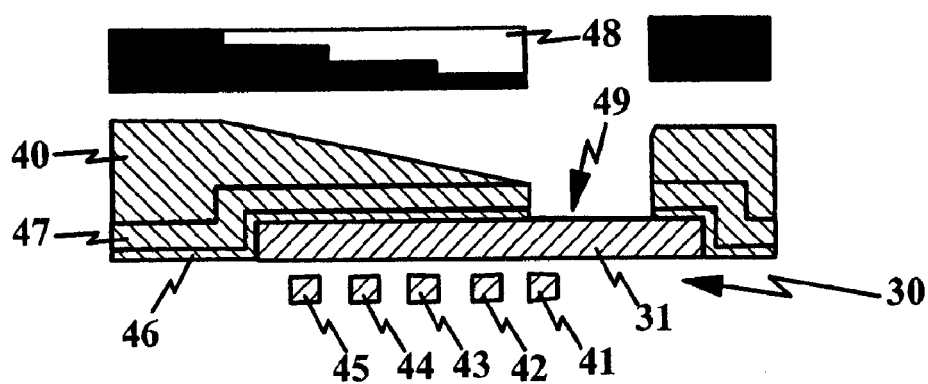
FIG. 4B is a cross-sectional view of the isolated test structure of the present invention taken along line 4—4 of FIG. 4A and with the passivating material deposited and exposed through a half tone mask to create the opening on the isolated test structure.

In using the isolated test structure 30 of the present invention for determining whether the wafer containing the integrated circuits is completely covered with passivating material, the test structure 30 is shown in FIG. 4A with a passivating coating 40 covering the plate 31 and all but one wire 41 showing in the opening 49. FIG. 4B, a cross-sectional view of FIG. 4A, shows more details of the test structure and the wires 41, 42, 43, 44, and 45, which are about 4 µ thick and spaced about 20 µ apart beneath plate 31. Before depositing the passivating material 40, the test structure 30 is formed with a silicon oxide layer 46 and a silicon nitride layer 47 on the plate 31. After deposition of the passivating material 40, herein sensitized polyimide such as HD4000 and HD7510 manufactured by Hitachi Corporation, the polyimide is exposed to an ultra violet light source (not shown) through a half tone mask 48 to yield a slope in the polyimide over the plate 31. The developed polyimide is used as a mask to etch the silicon nitride layer 47 and silicon oxide layer 46 to the plate 31 to leave an opening 49 in the polyimide, the silicon nitride and silicon oxide. The size of the opening 49 is related to the thickness of the passivating material 40 deposited on the wafer 11 during manufacture. The thicker the coating of passivating material, herein polyimide, the smaller the opening 49 and the fewer wires that will show in the opening. It can be calculated what the size of the opening should be for complete coverage of the integrated circuits of the wafer 11. For example, it was calculated relative to the thickness of the polyimide in FIGS. 4A and 4B that if only the first wire 41 would show in the opening 49, then the wafer 11 with the integrated circuits would be completely covered.

In contrast to the example of FIGS. 4A and 4B, test structure 30 of FIGS. 5A and 5B is the same except that the passivating material 50, again herein sensitized polyimide, is thinner and the opening 51 is wider. The plan view of FIG. 5A shows the conductive plate 31 and the wires 41, 42, and 43 in the opening 51. In the cross-sectional view of FIG. 5B, the silicon oxide layer 46 and silicon nitride layer 47 are shown. A half tone mask (not shown) again is used to expose the polyimide 50 to create the slope. When the silicon nitride 47 and silicon oxide 46 are etched using the polyimide as a mask, the opening 51 is formed down to the plate 31 with the wires 41, 42, 43, 44, and 45 underneath the plate. It was calculated that if more than the first wire 41 was showing in the opening, the passivating material would not completely cover the wafer with the integrated circuits. In this example, three wires 41, 42, and 43 are showing.

Although this invention has been described relative to specific embodiments for purposes of understanding, it will be realized that alterations and modifications may be made thereto without departing from the scope of the following claims. Therefore, the present embodiments are to be considered as illustrative and not restricted, and the invention is not be limited to the details given herein, but may be modified within the scope and equivalents of the following claims.

What is claimed is:

1. In the manufacturing an integrated circuit wafer, a method of monitoring the thickness of a material applied over the last metal layer of the wafer and determining that the material is sufficiently thick to completely passivate the wafer, comprising the steps of:
   forming a metal structure on the wafer during manufacture;
   coating the wafer, including said metal structure, with a passivating material;
   creating, in said coating, an opening in the passivating material and a slope from the full thickness of the material in said metal structure;
   establishing a relationship between complete passivation of the wafer and said size of opening and said slope from the full thickness of the passivating material; and
   examining the size of the opening and the slope of the material after coating to determine whether the wafer is completely covered with passivating material.

2. The method of claim 1 wherein the passivating material is spin coated on the wafer.

3. The method of claim 1 wherein the passivating material is polyimide.

4. The method of claim 3 wherein said polyimide is photosensitive.

5. The method of claim 4 wherein the photosensitive polyimide is exposed through a half tone mask.

6. The method of claim 1 wherein the test structure is formed with an opening for determining coverage of the wafer with the passivating material.

7. The method of claim 6 wherein the test structure comprises thin wires, some or all of which are uncovered in the opening for determining coverage of the wafer with the passivating material.

8. The method of claim 1 wherein the passivating material is exposed through a half tone mask to form the slope and the opening in the passivating material.

9. The method of claim 1 wherein the conductive metal of the test structure is formed of aluminum.

10. The method of claim 1 wherein the conductive metal of the test structure is formed of copper.

11. An apparatus for monitoring the thickness of a passivating material applied over the final metal layer on a wafer containing integrated circuits comprising:
   test structure means isolated from said integrated circuit comprising a metal plate and metal wires of the dimensions of the plates and wires of the integrated circuits;

means for applying the passivating material over said final metal of the integrated circuit on the wafer and over said test structure;

means for creating a slope in the passivating material to said plate and an opening of a size dependent upon the thickness of the passivating material and a relationship to the coverage of material over the wafer of integrated circuits; and optical means for viewing the opening and determining the coverage of the passivating material over the wafer of integrated circuits.

12. The apparatus of claim 11 wherein slope creating means is by exposing the passivating material through a half tone mask.

13. The apparatus of claim 11 wherein the optical means is a microscope.

14. The apparatus of claim 11 wherein the thickness of the wires of the test structure is about 4 μ.

15. The apparatus of claim 11 wherein the wires are disposed parallel beneath said plate and extend beyond the edges of the plate.

16. The apparatus of claim 11 wherein the wires are spaced apart by about 20 μ.

17. The apparatus of claim 11 wherein the passivating applying means is a spin coating device.

18. A method of monitoring the thickness of a passivating material applied over the final metal layer of the wafer containing integrated circuits to determine that the material completely covers the wafer, comprising the steps of:

forming a metal test structure on the wafer during manufacture, said test structure comprising a plate with parallel thin wires extending beyond the plate;

coating the wafer, including said metal structure, with a passivating material as the final upper layer on the wafer;

creating, in said coating of passivating material at the test structure by exposing the material through a half tone mask, an opening in the passivating material and a slope from the full thickness of the material in said test structure;

establishing a relationship between complete passivation of the wafer and said size of opening and said slope from the full thickness of the passivating material; and examining the size of the opening and the slope of the material after coating to determine whether the wafer is completely covered with the passivating material.

19. The method of claim 18 wherein said wires are positioned beneath said plate.

20. The method of claim 18 wherein said wires are positioned in the same plane as said plate.

* * * * *